(12) United States Patent
Ono

(10) Patent No.: US 10,008,651 B2
(45) Date of Patent: Jun. 26, 2018

(54) LIGHT EMITTING DEVICE AND WIRING BOARD THEREOF

(71) Applicant: NICHIA CORPORATION, Anan-shi (JP)

(72) Inventor: Masato Ono, Sagamihara (JP)

(73) Assignee: NICHIA CORPORATION, Anan-shi (JP)

( * ) Notice: Subject to any disclaimer, the term of this patent is extended or adjusted under 35 U.S.C. 154(b) by 0 days. days.

(21) Appl. No.: 15/267,146

(22) Filed: Sep. 16, 2016

(65) Prior Publication Data
US 2017/0092827 A1    Mar. 30, 2017

(30) Foreign Application Priority Data
Sep. 24, 2015   (JP) .................................. 2015-187492

(51) Int. Cl.
*H01L 33/62*      (2010.01)
*H01L 25/075*     (2006.01)
*H01L 33/48*      (2010.01)
*H05K 1/18*       (2006.01)

(52) U.S. Cl.
CPC .......... *H01L 33/62* (2013.01); *H01L 25/0753* (2013.01); *H01L 33/486* (2013.01); *H05K 1/181* (2013.01); *H01L 2224/48465* (2013.01); *H01L 2224/49113* (2013.01); *H05K 2201/10106* (2013.01); *H05K 2203/048* (2013.01); *H05K 2203/049* (2013.01); *H05K 2203/1173* (2013.01); *Y02P 70/611* (2015.11)

(58) Field of Classification Search
CPC .... H01L 33/62; H01L 33/486; H01L 25/0753
USPC ........................................................ 315/362
See application file for complete search history.

(56) References Cited

U.S. PATENT DOCUMENTS

| 2007/0096114 A1* | 5/2007 | Aoki | ..................... H01L 33/486 257/79 |
| 2008/0083931 A1 | 4/2008 | Bando et al. | |
| 2010/0176751 A1* | 7/2010 | Oshio | ..................... H01L 33/62 315/362 |

(Continued)

FOREIGN PATENT DOCUMENTS

| JP | 2008-112966 | | 5/2008 |
| JP | 2009-064979 | * | 3/2009 |

(Continued)

*Primary Examiner* — Benjamin Sandvik
*Assistant Examiner* — Farid Khan
(74) *Attorney, Agent, or Firm* — Mori & Ward, LLP

(57) ABSTRACT

A first conductive pattern is disposed on a substrate. A first conductive pattern includes a first element mount portion and a first wire connection portion. A second conductive pattern is disposed on the substrate to be spaced apart from the first conductive pattern. The second conductive pattern includes a second element mount portion and a groove. The second element mount portion has a first side, a second side substantially orthogonal to the first side, and a third side substantially orthogonal to the first side and substantially parallel to the second side. The groove extends substantially parallel to the first side. A rectangular first light emitting element is disposed on the first element mount portion. A rectangular second light emitting element is disposed on the second element mount portion adjacent to the first light emitting element. A wire connects the second light emitting element to the first wire connection portion.

14 Claims, 6 Drawing Sheets

(56) References Cited

U.S. PATENT DOCUMENTS

| | | | |
|---|---|---|---|
| 2011/0133217 A1* | 6/2011 | Hakamata | F21S 48/1109 257/88 |
| 2011/0175548 A1* | 7/2011 | Nishimura | F21K 9/00 315/294 |
| 2011/0248289 A1* | 10/2011 | Hsieh | H01L 25/0753 257/88 |
| 2012/0080674 A1* | 4/2012 | Shimizu | H01L 24/97 257/48 |
| 2013/0070452 A1* | 3/2013 | Urano | H05K 1/181 362/231 |
| 2013/0306976 A1 | 11/2013 | Haruta | |
| 2014/0027794 A1* | 1/2014 | Yagi | H01L 25/0753 257/88 |
| 2015/0162502 A1* | 6/2015 | Fujita | H01L 33/486 257/98 |
| 2015/0262988 A1* | 9/2015 | Yagi | H01L 25/0753 362/311.02 |
| 2016/0133611 A1* | 5/2016 | Minoda | H01L 27/153 257/88 |

FOREIGN PATENT DOCUMENTS

| | | | |
|---|---|---|---|
| JP | 2009-64979 | | 3/2009 |
| JP | 2010-526425 | | 7/2010 |
| JP | 2011-176265 | | 9/2011 |
| JP | 2011-216514 | | 10/2011 |
| JP | 2012-151415 | | 8/2012 |
| JP | 2015032869 | * | 7/2013 |
| JP | 2014-027214 | | 2/2014 |
| JP | 2014-042012 | | 3/2014 |
| JP | 2014-53614 | | 3/2014 |
| JP | 2015-032869 | | 2/2015 |

\* cited by examiner

LIGHT EMITTING DEVICE AND WIRING BOARD THEREOF

CROSS-REFERENCE TO RELATED APPLICATIONS

The present application claims priority under 35 U.S.C. § 119 to Japanese Patent Application No. 2015-187492, filed Sep. 24, 2015, entitled "Light emitting device". The contents of this application are incorporated herein by reference in their entirety.

BACKGROUND OF THE INVENTION

Technical Field

The present invention relates to a light emitting device and a wiring board.

Light emitting diodes have been adopted as various light sources in illumination devices and optical communication devices from the viewpoints of high light emission efficiency, low power consumption, and long life. Especially, a printer, a scanner, or a multifunctional peripheral having the functions as the printer and copier includes a light emitting device having a plurality of light emitting elements mounted on a substrate in a row.

Discussion of the Background

JP-A 2011-216514 discloses one example of the light emitting device having the plurality of light emitting elements mounted on the substrate in a row. The disclosed light emitting device has a configuration in which an element mount region where a light emitting element is mounted and a wire connection region where a wire extending from the adjacent light emitting element is connected are formed on a single electrode pattern.

SUMMARY OF THE INVENTION

According to one aspect of the present invention, a light emitting device includes a substrate, a first conductive pattern, a second conductive pattern, a rectangular first light emitting element, a rectangular second light emitting element, and a wire. The first conductive pattern is disposed on the substrate. The first conductive pattern includes a first element mount portion and a first wire connection portion. The second conductive pattern is disposed on the substrate to be spaced apart from the first conductive pattern. The second conductive pattern includes a second element mount portion and a groove. The second element mount portion has a first side, a second side substantially orthogonal to the first side, and a third side substantially orthogonal to the first side and substantially parallel to the second side. The groove extends substantially parallel to the first side. The rectangular first light emitting element is disposed on the first element mount portion. The rectangular second light emitting element is disposed on the second element mount portion adjacent to the first light emitting element. The wire connects the second light emitting element to the first wire connection portion.

According to another aspect of the present invention, a wiring board includes a substrate, a first conductive pattern, and a second conductive pattern. The first conductive pattern is disposed on the substrate. The first conductive pattern includes a first element mount portion and a first wire connection portion. The second conductive pattern is disposed on the substrate to be spaced apart from the first conductive pattern. The second conductive pattern includes a second element mount portion and a groove. The second element mount portion has a first side, a second side substantially orthogonal to the first side, and a third side substantially orthogonal to the first side and substantially parallel to the second side. The groove extends substantially parallel to the first side.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
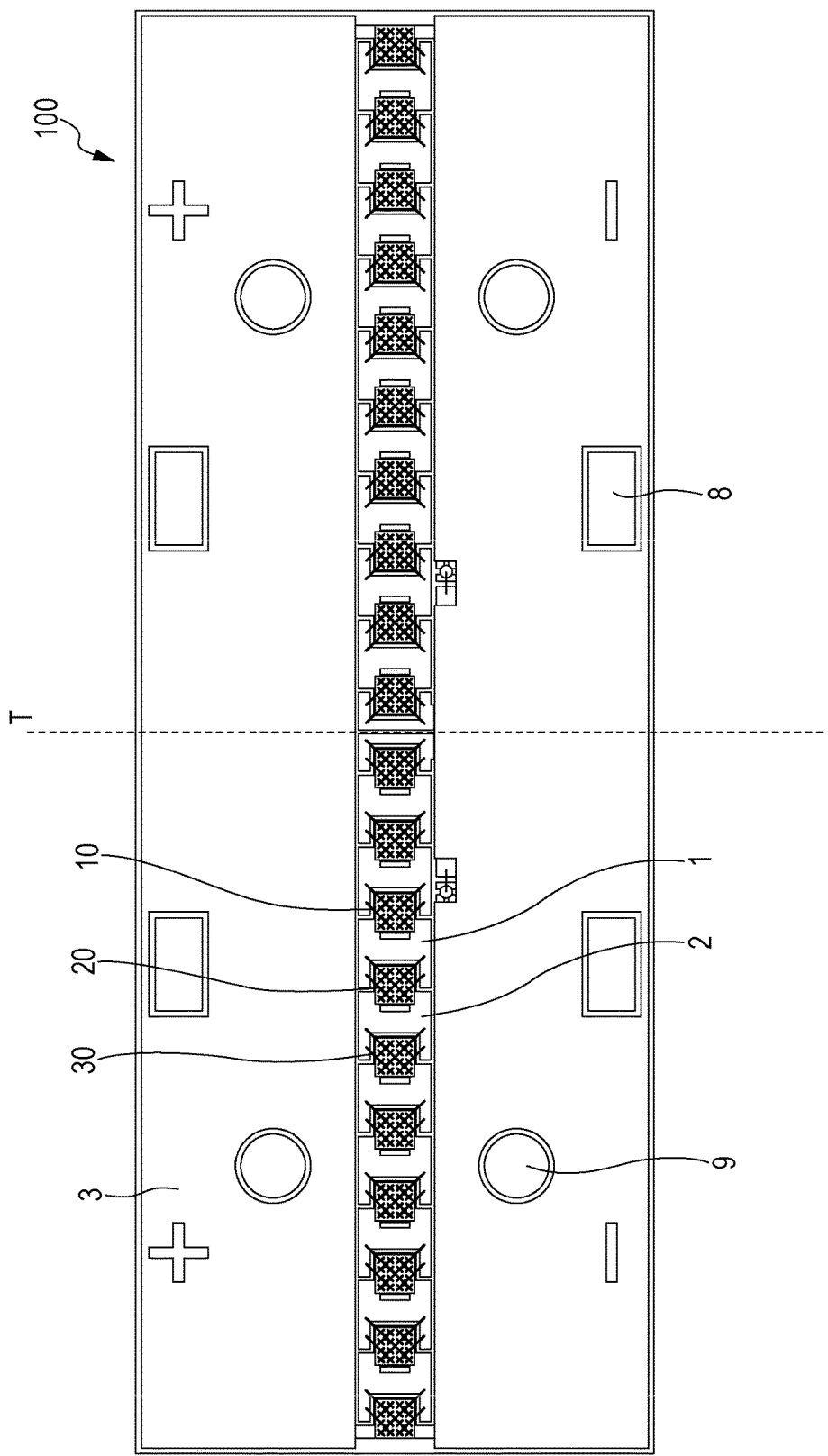
FIG. 1 is a schematic top view illustrating a light emitting device according to an exemplary embodiment.

The embodiments will now be described with reference to the accompanying drawings, wherein like reference numerals designate corresponding or identical elements throughout the various drawings.

Hereinafter, exemplary embodiments will be described with reference to the drawings. It should be noted herein that exemplary embodiments to be described below are intended to merely specify the technical idea of the present disclosure and are not intended to limit the technical range of the present disclosure. A configuration described in one embodiment can be applied to another embodiment unless otherwise specified. In the following description, terms designating specific directions and positions (such as "up", "down", "right, "left", and different terms including these terms) are used as needed; however, those terms are used to facilitate the understanding of the exemplary embodiments of the present invention with reference to the drawings. Hence, the technical range of the present disclosure is not limited to the meanings of these terms.

It should also be noted herein that sizes of members and a positional relation between the members in the respective drawings are sometimes exaggerated to clarify the description. Furthermore, identical reference signs in the drawings represent identical portions or members.

First Embodiment

Figure 2:
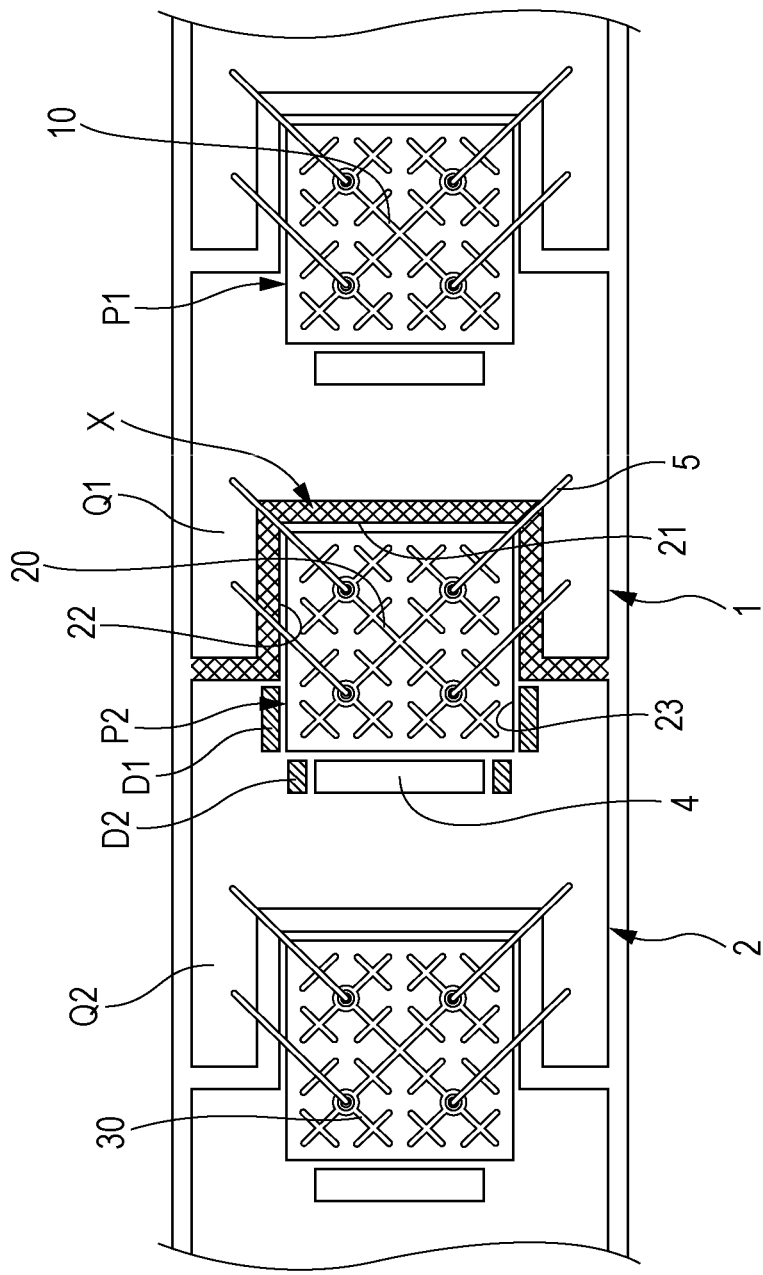
FIG. 2 is a schematic enlarged top view of the light emitting device in FIG. 1.

FIG. 1 is a schematic top view illustrating a light emitting device 100 according to a first embodiment of the present disclosure. FIG. 2 is a schematic enlarged top view of the light emitting device 100.

The light emitting device 100 illustrated in FIGS. 1 and 2 includes a substrate 3, a first conductive pattern 1 and a second conductive pattern 2 disposed on the substrate 3, a rectangular first light emitting element 10 disposed on the first conductive pattern 1, a rectangular second light emitting element 20 disposed on the second conductive pattern 2, beside the first light emitting element 10 and, and a wire 5 connecting the second light emitting element 20 to the first conductive pattern 1. The second conductive pattern 2 has a groove portion (a groove) 4 parallel to a first side 21.

Specifically, the light emitting device 100 includes the substrate 3 having a plurality of conductive patterns including the first conductive pattern 1 and the second conductive pattern 2, and 20 light emitting elements including the first light emitting element 10 and the second light emitting element 20 each having a rectangular shape in top view. The light emitting elements are mounted on a surface of the substrate 3 and are arranged in a row. More specifically, the first light emitting element 10 is mounted on the first conductive pattern 1, and the second light emitting element 20 is mounted on the second conductive pattern 2. Furthermore, four n-electrodes are formed on an upper surface of the second light emitting element 20 are connected to first wire connection portions Q1 of the first conductive pattern 1 by the four conductive wires 5, respectively. The plurality of conductive patterns illustrated in FIG. 1 are line-symmetric with respect to a center line T, and accordingly the plurality of wires are also line-symmetric with respect to the center line T.

Substrate

The substrate 3 is a plate-like substrate made of an insulating material such as glass epoxy resin or ceramic composed of aluminum nitride, or copper used as a base material. On the upper surface of the substrate 3, the plurality of conductive patterns including the first conductive pattern 1 and the second conductive pattern 2, and electrode patterns are formed by a method such as electrolytic plating or etching, with a conductor material such as copper. In the first embodiment, the substrate 3 is a plate-like substrate made of copper used as a base material which has a high degree of freedom in a substrate design, and the conductive pattern includes a copper base and a gold thin film formed on a surface of the copper base.

First Conductive Pattern, Second Conductive Pattern

As illustrated in FIGS. 1 and 2, the first conductive pattern 1 in this embodiment includes a first element mount portion P1, and the two first wire connection portions Q1 provided to sandwich a second side 22 and a third side 23 of a second element mount portion P2 for the second light emitting element 20. Furthermore, the second conductive pattern 2 includes the second element mount portion P2, and two second wire connection portions Q2 provided on both sides of a third light emitting element 30. The second conductive pattern 2 has almost the same shape as the first conductive pattern 1.

As illustrated in FIG. 2, the first conductive pattern 1 and the second conductive pattern 2 are insulated and separated from each other with an insulating region X (hatched region) interposed therebetween. Here, the insulating region X corresponds to a region where no conductor is formed on the substrate 3, and also corresponds to a low-wettability region which has no wettability relative to a bonding material which will be described below or is lower in wettability than the conductive pattern or the electrode pattern. A width of the insulating region X is 10 μm to 100 μm. Furthermore, the light emitting device 100 according to this embodiment may have the conductive pattern on which the light emitting element is not mounted or to which the wire is not connected.

The second conductive pattern 2 in this embodiment includes the second element mount portion P2 and the second wire connection portions Q2, similar to the first conductive pattern 1. The second element mount portion P2 projects toward the first conductive pattern 1 with respect to the second wire connection portions Q2. Specifically, the second element mount portion P2 has the second side 22 successively extending from the second wire connection portion Q2 toward the first conductive pattern, the third side 23 successively extending from the second wire connection portion Q2 toward the first conductive pattern, in parallel to the second side 22, and the first side 21 connected successively to the second side 22 and the third side 23. In the light emitting device 100 of the present disclosure, the first side 21, the second side 22, and the third side 23 are provided along an outer shape of the second light emitting element 20 and has such a shape that a U shape is turned by −90 degrees in this embodiment.

The second conductive pattern 2 has the groove portion 4 where the insulating substrate 3 is exposed. In other words, the second conductive pattern 2 has the groove portion 4 penetrating through the conductor. Thus, the groove portion 4 is formed parallel to the first side 21. Specifically, the groove portion 4 is formed parallel to the first side 21 across the second light emitting element 20. Herein, the second element mount portion P2 refers to a region defined by the first side 21, the second side 22, the third side 23, and the groove portion 4. In other words, the second light emitting element 20 is mounted on the region defined by the first side 21, the second side 22, the third side 23, and the groove portion 4. The groove portion 4 is formed into a shape extending along the side of the second light emitting element 20 to improve mounting precision of the second light emitting element 20, or to prevent the bonding material of the second light emitting element 20 from flowing toward the second wire connection portion Q2. In the light emitting device 100 according to this embodiment, as illustrated in FIG. 2, the groove portion 4 is formed into a substantially rectangular thin and long shape in top view. However, the shape of the groove portion 4 is not limited to the above shape, and it may include various shapes such as polygonal shapes, circular shapes, and combined shapes.

In this way, by virtue of the groove portion 4, the four sides of the rectangular second light emitting element 20 are surrounded with the first side 21, the second side 22, the third side 23, and the groove portion 4, so that an appropriate amount of the bonding material can be always disposed in an appropriate position. Thus, the second light emitting element 20 can be positioned with high precision by a self-alignment effect. Furthermore, an edge of the groove portion 4 functions as a barrier to prevent the fluid bonding material for the second light emitting element 20 from flowing toward the second wire connection portion Q2.

Furthermore, in the light emitting device 100 of the present disclosure, the groove portion 4 is formed longer than the second side 22 and the third side 23, with respect to the second light emitting element 20 having the substantially square shape in top view. Thus, a region D1 where the bonding material flows from the second side 22 or the third side 23 is larger than a region D2 where the bonding material flows from the groove portion 4. Therefore, the bonding material for the second light emitting element 20 is likely to flow toward the second side 22 and the third side 23 in this configuration, so that the bonding material can be prevented from flowing toward the second wire connection portion Q2.

The groove portion 4 in this embodiment is spaced apart from the insulating region X. In other words, the groove portion 4 is not connected to the insulating region X. In this configuration, the second element mount portion P2 is electrically connected to the second wire connection portion Q2, and the bonding material for the second light emitting element 20 does not linearly flows toward the second wire connection portion Q2. Thus, the second light emitting element 20 can be mounted in the region surrounded with the first side 21, the second side 22, the third side 23, and the groove portion 4 with high precision. The mount region of the light emitting element is preferably larger than the light emitting element by about 0.1 mm. Thus, when the light emitting element is mounted with the bonding material, the self-alignment effect works effectively, so that the light emitting element can be mounted within a mount range with high precision.

Wiring Board

As described above, the light emitting device 100 according to this embodiment includes the wiring board including the substrate 3, the first conductive pattern 1 that is disposed on the substrate 3 and includes the first element mount portion P1 and the first wire connection portions Q1, and the second conductive pattern 2 that is disposed on the substrate 3 and includes the second element mount portion P2 having the first side 21, the second side 22 orthogonal to the first side 21, and the third side 23 orthogonal to the first side 21 and parallel to the second side 22. The second conductive pattern 2 is spaced apart from the first conductive pattern 1, and the second conductive pattern 2 has the groove portion 4 parallel to the first side 21. With this wiring board, the appropriate amount of bonding material can be always applied to the element mount portion, so that a high self-alignment effect can be provided in the wiring board. In addition, the groove portion is formed between the element mount portion and the wire connection portion in the one conductive pattern, so that even when the light emitting element is mounted on the element mount portion with the bonding material, the bonding material is not likely to flow toward the wire connection portion in the wiring board.

First Light Emitting Element, Second Light Emitting Element

According to this embodiment, the first light emitting element 10 and the second light emitting element 20 are disposed adjacent to each other. Specifically, the first light emitting element 10 and the second light emitting element 20 are disposed such that one side of the rectangular first light emitting element 10 in top view and one side of the rectangular second light emitting element 20 in top view are substantially parallel to each other.

The light emitting element in this embodiment is an LED made of GaN-based semiconductor among nitride-based composition semiconductors (expressed by a general formula of $In_xAl_yGa_{1-x-y}N (0 \leq x, 0 \leq y, x+y \leq 1)$. Furthermore, the light emitting element may be made of ZnSe-based, InGaAs-based, AlInGaP-bassed composition semiconductor in addition to the nitride-based composition semiconductor.

In the light emitting device 100 according to this embodiment, the light emitting element preferably emits light in an ultraviolet region having a light emission peak wavelength of not more than 400 nm. The light emitting device 100 having those linearly disposed light emitting elements which emit the light in the ultraviolet region is used for the purpose of curing printing ink or resin; however, this purpose sometimes requires almost uniform illumination intensity from the linearly disposed illumination portions. In the light emitting device 100 according to this embodiment, the light emitting element can be mounted on the mount position with high precision, so that the illumination intensity of the light in the ultraviolet region can be highly uniform in the light emitting device 100.

The light emitting element may be formed on an attached substrate other than a growth substrate. In this case, after the light emitting element has been prepared by forming an n-type semiconductor layer, a light emitting layer (active layer), and a p-type semiconductor layer on a growth substrate, another substrate is attached to the p-type semiconductor layer. Then, the growth substrate is removed, whereby the light emitting element is formed on the attached substrate. The attached substrate is made of metal such as copper, tungsten, or a copper-tungsten alloy, or sapphire.

Furthermore, the light emitting element, in which an n-electrode and a p-electrode are formed on the same surface, may be formed on the growth substrate 3 made of sapphire and serving as a support substrate which is not removed.

Figure 3:
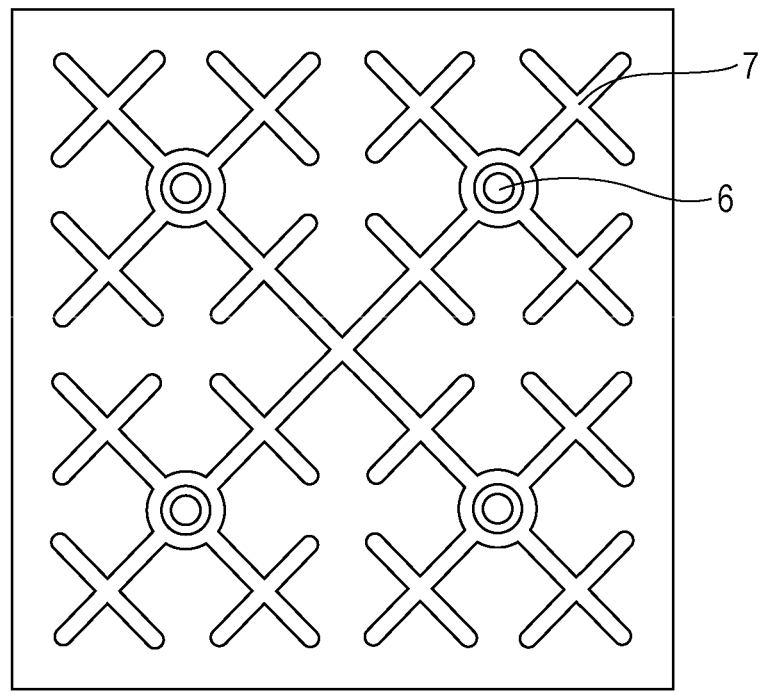
FIG. 3 is a schematic top view illustrating a light emitting element according to an exemplary embodiment.

The light emitting element in this embodiment has four n-electrodes on diagonal lines of the rectangular upper surface (light extraction surface) of the light emitting element. More specifically, the four n-electrodes are symmetrically disposed in right and left, and up and down directions around a center of the light emitting element. Moreover, the respective n-electrodes are connected to the same conductive pattern through the four wires extending therefrom. Specifically, among the four n-electrodes on the upper surface of the second light emitting element 20, the two n-electrodes near the second side 22 are connected to the first wire connection portion Q1 provided near the second side 22 through the two extending wires 5, respectively and two n-electrodes near the third side 23 are connected to the first wire connection portion Q1 provided near the third side 23 through the two extending wires 5, respectively. A p-electrode serving as a lower electrode is provided on a back surface (bonding surface) of the light emitting element. The p-electrode on the back surface of the light emitting element is bonded to the element mount portion of the conductive pattern with a solder or conductive paste. The n-electrode and the p-electrode are formed by vapor deposition with metal material such as Au which is small in electric resistance and superior in corrosion resistance. FIG. 3 is a schematic top view illustrating the light emitting element in this embodiment. As illustrated in FIG. 3, the n-electrode as the upper electrode preferably has a shape composed of a pad portion 6 used for wire bonding, and an auxiliary electrode portion 7 connected to the pad portion 6 and having a width smaller than that of the pad portion 6. Thus, by providing the auxiliary electrode portion 7, a current can be supplied to a region far from the pad portion 6, so that almost uniform light intensity can be provided in the light emission surface. Furthermore, the p-electrode as the lower electrode is preferably formed on almost a whole back surface of the light emitting element so that it can be sufficiently bonded to the conductive pattern.

Wire

The n-electrodes of the second light emitting element 20 are connected to the two first wire connection portions Q1 through the four wires 5. Each of the wires 5 is bonded to the first wire connection portion Q1 that projects toward the second conductive pattern 2, as illustrated in FIGS. 1 and 2.

The wire 5 is preferably laid from the pad portion 6 of the second light emitting element 20 to the first wire connection portion Q1 over the auxiliary electrode portion 7 formed on the upper surface of the second light emitting element 20. Specifically, as illustrated in FIGS. 1 and 2, the auxiliary electrode portion 7 extending from the pad portion 6 of the second light emitting element 20 is inclined at an angle of 45 degrees with respect to an arrangement direction of the first light emitting element 10 and the second light emitting element 20. Moreover, the wire 5 that connects the second light emitting element 20 to the first wire connection portion Q1 is laid from the pad portion 6 over the auxiliary electrode portion 7 at an angle of 45 degrees with respect to the arrangement direction of the first light emitting element 10 and the second light emitting element 20. When the wire 5 is laid in this way, it is possible to reduce an absorption ratio by the wire 5 in the light emitted from the second light emitting element 20. As a result, the light emitting device can be high in light extraction efficiency.

Furthermore, the wire 5 may be laid on the first wire connection portion Q1 at an angle of 90 degrees with respect to the arrangement direction of the first light emitting element 10 and the second light emitting element 20. When the wire 5 is laid in this way, the wire 5 can be short in length, and the wire 5 is not likely to be broken or fused, so that the reliability of the light emitting device 100 can be improved. In addition, the wiring method is not limited to the above method, and the wiring direction and the wire length can be adjusted by appropriate setting.

Hereinafter, the self-alignment effect of the light emitting element will be described in detail. In a case where the second light emitting element 20 is mounted on the second element mount portion P2 by a reflow method, the bonding material (such as solder paste) is previously applied around the second element mount portion P2 and then comes in contact with the lower electrode of the second light emitting element 20, and when the bonding material is dissolved, it partially gathers in the second element mount portion P2 having high wettability without gathering in the insulating region X and the groove portion 4 having low wettability. Thus, corner positions formed with the first side 21 and the second side 22, and the first side 21 and the third side 23 define two corner positions (closer to the first conductive pattern 1) of the second light emitting element 20. Furthermore, the groove portion 4 defines the other two corner positions of the second light emitting element 20. As a result, the mount position of the second light emitting element 20 can be defined with high precision. In addition, the four corner positions of the second light emitting element 20 do not necessarily completely coincide with the corner positons defined by the sides and the groove portion, but the four corner positions of the second light emitting element 20 are to be disposed closely to the corresponding corner positions defined by the sides and the groove portion.

The above description has been given by use of the second conductive pattern 2 and the second light emitting element 20, but the same is true for the first conductive pattern 1 and the first light emitting element 10, or another conductive pattern and light emitting element mounted thereon, in this embodiment.

According to this embodiment, the other conductive patterns are formed on the substrate 3 similarly to the first conductive pattern 1 and the second conductive pattern 2. Furthermore, the other light emitting elements and wires connected thereto are also formed into similar configurations. That is, according to this embodiment, the plurality of conductive patterns and the 20 light emitting elements are provided by repeating the first conductive pattern 1 and the second conductive pattern 2 and reversely arranged with respect to the center line T.

With the light emitting device 100 according to the first embodiment, the bonding material for the light emitting element can be prevented from reaching the wire connection portion. Furthermore, the light emitting element can be mounted and positioned on the conductive pattern with high precision.

Second Embodiment

Figure 4:
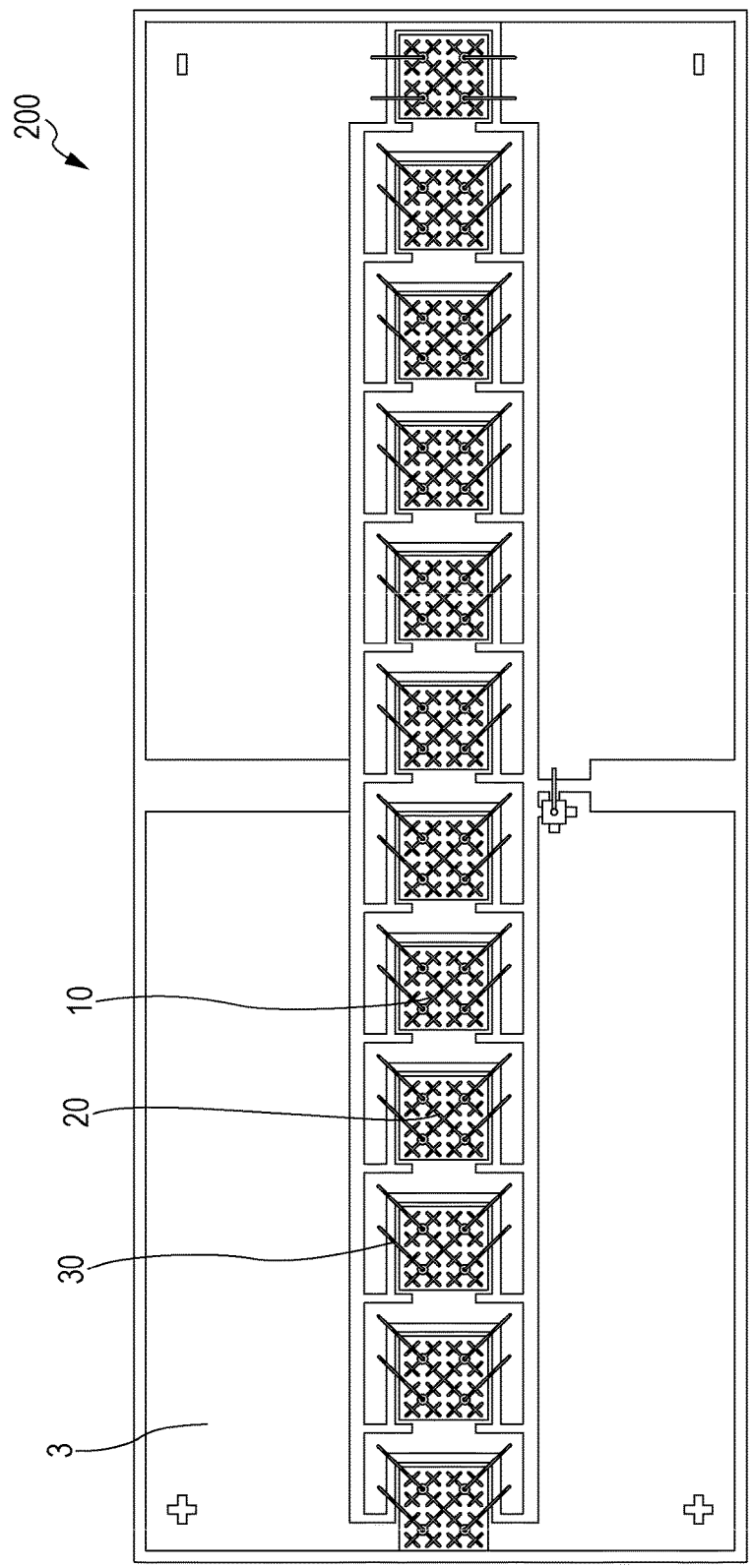
FIG. 4 is a schematic top view illustrating a light emitting device according to an exemplary embodiment.
Figure 5:
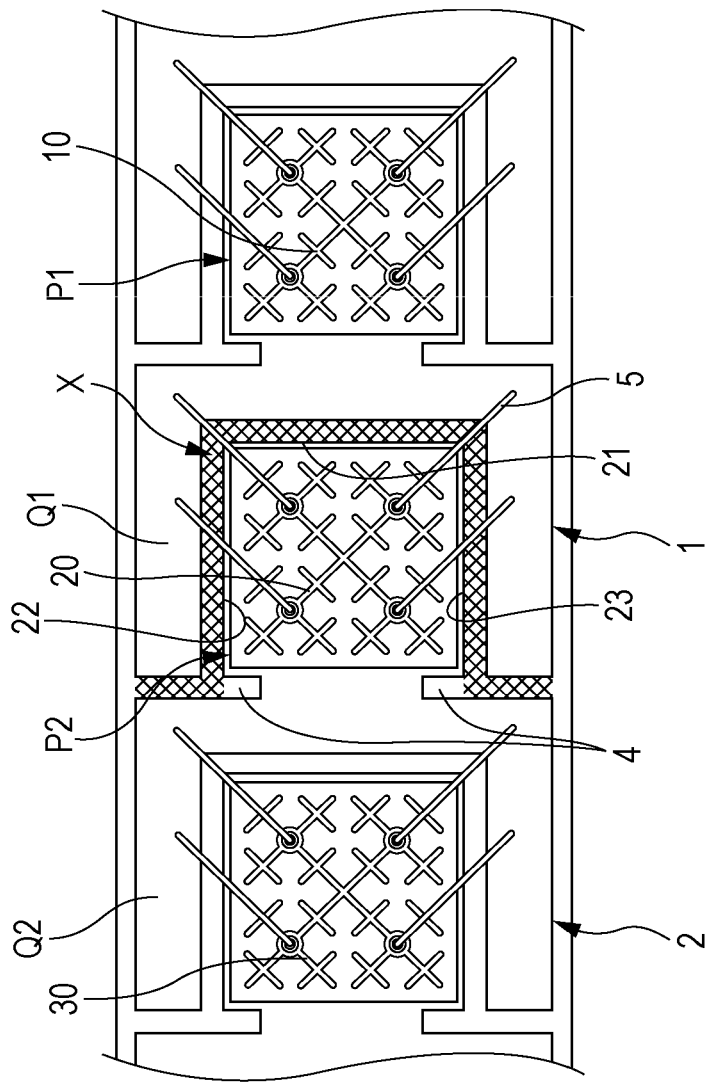
FIG. 5 is a schematic enlarged top view of the light emitting device in FIG. 4.

FIG. 4 is a schematic top view illustrating a light emitting device 200 according to a second embodiment of the present disclosure. Furthermore, FIG. 5 is a schematic enlarged top view of the light emitting device 200. As illustrated in FIGS. 4 and 5, a configuration of the light emitting element is similar to that in the first embodiment except that a groove portion 4 is connected to an insulating region X.

In the light emitting device 200, the groove portion 4 is connected to the insulating region X. Specifically, the insulating region X entirely surrounds three sides of the second light emitting element 20, and the groove portion 4 is connected to the insulating region X, projects from a second side 22 or a third side 23 to opposite side, and is formed parallel to a first side 21. More specifically, the second side 22 and the third side 23 of a second element mount portion P2 in top view are longer than corresponding sides of the second light emitting element 20. Moreover, the groove portion 4 projecting from the second side 22 and the groove portion 4 projecting from the third side 23 are partially spaced apart from each other in order to electrically connect the second element mount portion P2 to a second wire connection portion Q2. The groove portion 4 projecting from the second side 22 or the third side 23 has a length which is preferably not less than one-tenth, more preferably not less than three-twentieth of the length of the opposite side of the second light emitting element 20 to the groove portion 4.

In the light emitting device 200 according to this embodiment, corner positions formed by the second side 22, the third side 23, and the groove portion 4 define two corner positions (farther from the first light emitting element 10) of the second light emitting element 20. In addition, corner positions formed by the first side 21 and the second side 22, and the first side 21 and the third side 23 define two corner positions (closer to the first light emitting element 10) of the second light emitting element 20.

As described above, the light emitting element can be mounted on the conductive pattern with high precision. Furthermore, since the groove portion 4 projects from each of the second side 22 and the third side 23, the bonding material of the light emitting element can be prevented from flowing to the two second wire connection portions Q2. In this case, the groove portion 4 is preferably formed on a straight line connecting a center of the second light emitting element 20 to a grounding point of the wire 5 close to the second light emitting element 20. Thus, when the bonding material of the second light emitting element 20 is dissolved, the bonding material is prevented from flowing to the grounding point of the wire 5 in the shortest way. As a result, the bonding material for the second light emitting element 20 can be prevented from flowing into the second wire connection portion Q2.

Although the embodiments of the present invention have been described above, the present invention is not limited to the above-described embodiments and can be applied to various variation.

The second side and the third side of the element mount portion and the groove portion have lengths which are preferably not less than one-tenth, more preferably one-fourth, still more preferably a half of the opposite sides of the light emitting element to the second side, the third side, and the groove portion. Thus, the self-alignment effect can effectively work for the light emitting element.

The two wire connection portions provided in the one conductive pattern have the same length in the above embodiments. However, the two wire connection portions may have different lengths and may be appropriately set. When the wire connection portion is prolonged and comes close to the electrode of the light emitting element, the length of the wire can be reduced, so that reliability can be enhanced.

Figure 6:
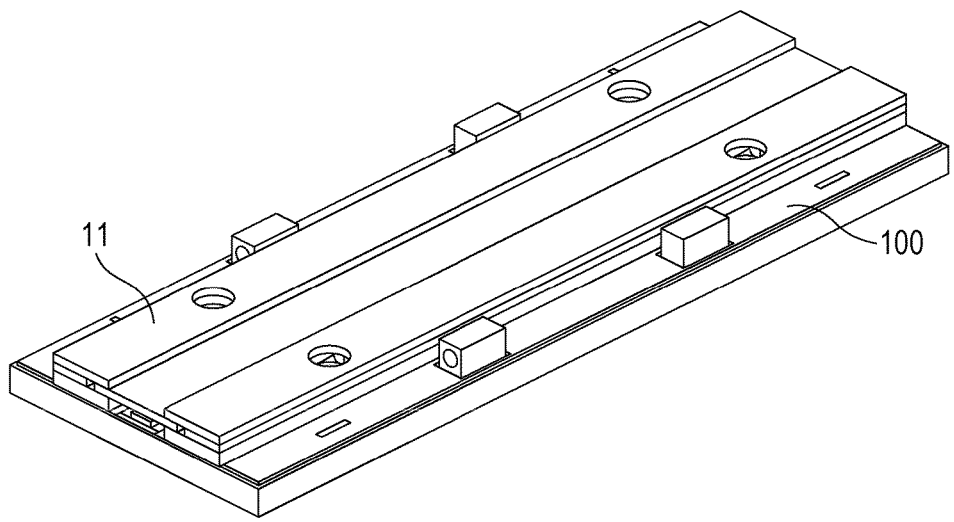
FIG. 6 is a schematic perspective view of the light emitting device provided with a glass cover according to an exemplary embodiment.
Figure 7:
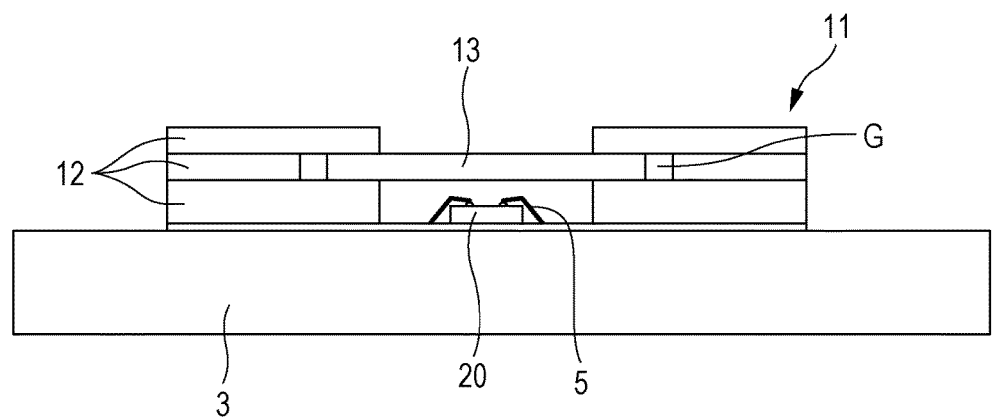
FIG. 7 is a schematic front view of the glass cover according to an exemplary embodiment.

The plurality of light emitting elements and the conductive patterns are preferably covered with a glass cover 11 provided over the substrate as illustrated in FIGS. 6 and 7. The glass cover 11 prevents the wire for connecting the light emitting element to the conductive pattern from being broken and protects the light emitting element from dust or water.

As illustrated in FIG. 7, the glass cover 11 preferably includes a glass holder 12 composed of a plurality of layers, and a glass plate 13 held by the glass holder 12 with a gap G interposed between them. The glass plate 13 of the glass cover 11 can be exchanged. Therefore, even when the glass plate 13 is damaged by outer force, it can be exchanged for the new glass plate 13. As a result, the light emitting device can be high in reliability. In addition, the shape of the glass cover is not limited to that described above, and a single-layer glass cover may be used. In this case, the single-layer glass cover is provided over the substrate with a bonding material formed thereon.

The substrate preferably has a notch in at least one of four corners. Thus, by providing the notch, in a case where an electric wire is drawn from beneath the substrate, the electric wire can be connected to the electrode or a connector 8 on the upper surface of the substrate through the notch. Thus, there is no need to separately provide a space for drawing the electric wire outside the substrate, and the electric wire can be easily routed. Furthermore, the notch can be formed in any region except for the conductive pattern, in addition to the four corners of the substrate.

The substrate preferably has one or more screw holes 9 to fix the substrate to a heat release portion. According to this fixing method, since the substrate having the screw hole 9 is fixed to the heat release portion with a screw, an operation is not complicated, compared with a fixing method which needs a soldering device, for example. Furthermore, instead of providing the screw hole 9 in the substrate, an edge of the substrate may be held with a clamp and the clamp may be screwed, as another fixing method which provides the same effect.

Each of the light emitting elements provided in the one light emitting device has the same structure, the same size, and the same top shape in the above embodiments, but the scope of the present invention is not limited to this. The light emitting elements may have a different structure, size, shape, shape of the electrode, position, light emission wavelength, characteristics, and the like in appropriate.

The substrate may have one or more protective elements to electrostatically protect the light emitting element. The protective element prevents the light emitting element having a low reverse withstand voltage from being destroyed by static electricity having a reverse direction polarity generated on the substrate. The protective element includes a Zener diode.

Furthermore, the number of the upper electrode pads of the light emitting element is not limited to four, and may be one to three or five or more. The number of the wires may also be one to three or five or more, according to the number of the pads.

Obviously, numerous modifications and variations of the present invention are possible in light of the above teachings It is therefore to be understood that within the scope of the appended claims, the invention may be practiced otherwise than as specifically described herein.

What is claimed is:
1. A light emitting device comprising:
a substrate;
a first conductive pattern disposed on the substrate and comprising:
 a first element mount portion; and
 a first wire connection portion;
a second conductive pattern disposed on the substrate to be spaced apart from the first conductive pattern and comprising:
 a second element mount portion having a first side, a second side substantially orthogonal to the first side, and a third side substantially orthogonal to the first side and substantially parallel to the second side; and
 a groove extending substantially parallel to the first side and connected to the second side or the third side;
a rectangular first light emitting element disposed on the first element mount portion;
a rectangular second light emitting element disposed on the second element mount portion adjacent to the first light emitting element; and
a wire connecting the second light emitting element to the first wire connection portion.

2. The light emitting device according to claim 1, wherein the second light emitting element is surrounded by the first side, the second side, the third side, and the groove.

3. The light emitting device according to claim 1, wherein the first wire connection portion is disposed to sandwich the second side and the third side.

4. The light emitting device according to claim 1, wherein the second side, the third side, and the groove have lengths which are not less than one-fourth of lengths of opposite sides of the second light emitting element to the second side, the third side, and the groove.

5. The light emitting device according to claim 1, wherein the second light emitting element includes a pad portion and an auxiliary electrode portion on an upper surface of the second light emitting element, and wherein the wire is laid over the auxiliary electrode portion to connect the pad portion to the first wire connection portion.

6. The light emitting device according to claim 5, wherein the wire is laid on the first wire connection portion at an angle of 45 degrees or 90 degrees relative to an arrangement direction of the first light emitting element and the second light emitting element on the substrate.

7. A wiring board comprising:
a substrate;
a first conductive pattern disposed on the substrate and comprising:
 a first element mount portion; and
 a first wire connection portion; and
a second conductive pattern. disposed on the substrate to be spaced apart from the first conductive pattern and comprising:
 a second element mount portion having a first side, a second side substantially orthogonal to the first side, and a third side substantially orthogonal to the first side and substantially parallel to the second side; and
 a groove extending substantially parallel to the first side and connected to the second side or the third side.

8. The wiring board according to claim 7, wherein the first wire connection portion is disposed to sandwich the second side and the third side.

9. The light emitting device according to claim 1, wherein the first light emitting element and the second light emitting element are to emit light in an ultraviolet region having a light emission peak wavelength of not more than 400 nm.

10. The light emitting device according to claim 1,
wherein the first light emitting element and the first element mount portion are electrically connected to each other via a first conductive bonding material, and
wherein the second light emitting element and the second element mount portion are electrically connected to each other via a second conductive bonding material.

11. The light emitting device according to claim 1, wherein the substrate includes a notch provided in at least one of four corners of the substrate.

12. The wiring board according to claim 7, wherein the substrate includes a notch provided in at least one of four corners of the substrate.

13. The light emitting device according to claim 1, wherein the substrate includes at least one screw hole.

14. The wiring board according to claim 7, wherein the substrate includes at least one screw hole.

* * * * *